(12) United States Patent
Konuma et al.

(10) Patent No.: US 7,462,372 B2
(45) Date of Patent: Dec. 9, 2008

(54) LIGHT EMITTING DEVICE, METHOD OF MANUFACTURING THE SAME, AND THIN FILM FORMING APPARATUS

(75) Inventors: Toshimitsu Konuma, Kanagawa (JP); Hiroko Yamazaki, Fukuoka (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 09/947,562

(22) Filed: Sep. 7, 2001

(65) Prior Publication Data

US 2002/0030443 A1    Mar. 14, 2002

(30) Foreign Application Priority Data

Sep. 8, 2000    (JP)    ............................. 2000-272547

(51) Int. Cl.
*B05D 5/06* (2006.01)
*B05D 1/32* (2006.01)
*C23C 16/00* (2006.01)
*C23C 14/00* (2006.01)

(52) U.S. Cl. .................. 427/66; 427/69; 427/255.29; 427/255.32; 427/282; 118/719; 118/720; 118/733; 118/70; 204/192.29

(58) Field of Classification Search .................. 427/66, 427/58, 64, 69–70, 162, 250, 255.6, 255.7, 427/282, 255.29, 255.32; 204/192.29, 192.1; 118/719–720, 733
See application file for complete search history.

(56) References Cited

U.S. PATENT DOCUMENTS

| 4,885,211 A | 12/1989 | Tang et al. |
| 4,951,601 A | 8/1990 | Maydan et al. |
| 5,049,780 A * | 9/1991 | Dobrowolski et al. ....... 313/509 |
| 5,247,190 A | 9/1993 | Friend et al. |
| 5,399,502 A | 3/1995 | Friend et al. |
| 5,399,936 A * | 3/1995 | Namiki et al. ............... 313/504 |
| 5,550,066 A | 8/1996 | Tang et al. |
| 5,585,949 A | 12/1996 | Yamazaki et al. |

(Continued)

FOREIGN PATENT DOCUMENTS

EP    0 880 306 A1    11/1998

(Continued)

OTHER PUBLICATIONS

J. A. Thornton, "Coating Deposition by Sputtering", in Deposition Technologies for Films and Coatings, ed. R. F. Bunshah et al., Noyes Publications, p. 170, (1982).*

(Continued)

*Primary Examiner*—Timothy Meeks
*Assistant Examiner*—Jimmy Lin
(74) *Attorney, Agent, or Firm*—Fish & Richardson, P.C.

(57) ABSTRACT

A method of manufacturing a light emitting device of upward emission type and a thin film forming apparatus used in the method are provided. A plurality of film forming chambers are connected to a first transferring chamber. The plural film forming chambers include a metal material evaporation chamber, an EL layer forming chamber, a sputtering chamber, a CVD chamber, and a sealing chamber. By using this thin film forming apparatus, an upward emission type EL element can be fabricated without exposing the element to the outside air. As a result, a highly reliable light emitting device is obtained.

34 Claims, 8 Drawing Sheets

U.S. PATENT DOCUMENTS

| | | | |
|---|---|---|---|
| 5,643,685 A | | 7/1997 | Torikoshi |
| 5,686,360 A | | 11/1997 | Harvey, III et al. |
| 5,811,177 A | | 9/1998 | Shi et al. |
| 5,817,366 A | * | 10/1998 | Arai et al. ................... 427/66 |
| 5,834,893 A | | 11/1998 | Bulovic et al. |
| 5,853,905 A | | 12/1998 | So et al. |
| 5,920,080 A | * | 7/1999 | Jones .......................... 257/40 |
| 5,925,980 A | | 7/1999 | So et al. |
| 5,994,836 A | | 11/1999 | Boer et al. |
| 6,010,796 A | * | 1/2000 | Kijima ....................... 428/690 |
| 6,049,167 A | | 4/2000 | Onitsuka et al. |
| 6,069,443 A | | 5/2000 | Jones et al. |
| 6,087,196 A | | 7/2000 | Sturm et al. |
| 6,132,280 A | * | 10/2000 | Tanabe et al. ................. 445/58 |
| 6,150,187 A | | 11/2000 | Zyung et al. |
| 6,187,457 B1 | * | 2/2001 | Arai et al. ................... 428/690 |
| 6,198,220 B1 | | 3/2001 | Jones et al. |
| 6,228,228 B1 | | 5/2001 | Singh et al. |
| 6,268,695 B1 | | 7/2001 | Affinito |
| 6,274,887 B1 | | 8/2001 | Yamazaki et al. |
| 6,280,861 B1 | | 8/2001 | Hosokawa et al. |
| 6,294,892 B1 | * | 9/2001 | Utsugi et al. ................. 318/640 |
| 6,317,248 B1 | * | 11/2001 | Agrawal et al. ............. 359/265 |
| 6,356,032 B1 | | 3/2002 | Suzuki et al. |
| 6,366,016 B1 | * | 4/2002 | Sakaguchi et al. .......... 313/506 |
| 6,366,017 B1 | * | 4/2002 | Antoniadis et al. .......... 313/506 |
| 6,380,687 B1 | | 4/2002 | Yamazaki |
| 6,413,645 B1 | | 7/2002 | Graff et al. |
| 6,432,561 B1 | * | 8/2002 | Yamazaki ................... 428/690 |
| 6,452,341 B1 | | 9/2002 | Yamauchi et al. |
| 6,552,496 B2 | | 4/2003 | Yamazaki |
| 6,774,573 B2 | | 8/2004 | Yamazaki et al. |
| 6,776,880 B1 | | 8/2004 | Yamazaki |
| 6,830,494 B1 | * | 12/2004 | Yamazaki et al. ............ 445/24 |
| 6,831,408 B2 | | 12/2004 | Hirano et al. |
| 2001/0002144 A1 | | 5/2001 | Yamazaki |
| 2001/0002703 A1 | | 6/2001 | Koyama |
| 2001/0003601 A1 | * | 6/2001 | Ueda et al. ................... 427/64 |
| 2001/0004190 A1 | | 6/2001 | Nishi et al. |
| 2001/0035863 A1 | | 11/2001 | Kimura |
| 2001/0055828 A1 | | 12/2001 | Kaneko et al. |
| 2002/0033664 A1 | | 3/2002 | Kobayashi |
| 2002/0044111 A1 | | 4/2002 | Yamazaki et al. |
| 2002/0093290 A1 | | 7/2002 | Yamazaki |
| 2003/0080338 A1 | | 5/2003 | Yamazaki et al. |
| 2003/0116772 A1 | | 6/2003 | Yamazaki et al. |
| 2003/0214246 A1 | | 11/2003 | Yamazaki et al. |
| 2005/0006667 A1 | | 1/2005 | Yamazaki et al. |
| 2005/0035708 A1 | | 2/2005 | Yamazaki et al. |

FOREIGN PATENT DOCUMENTS

| | | |
|---|---|---|
| EP | 0880303 A1 | 11/1998 |
| EP | 0 892 028 | 1/1999 |
| EP | 0 987 700 | 3/2000 |
| EP | 0 998 170 A2 | 5/2000 |
| EP | 0 999 595 | 5/2000 |
| JP | 60-121616 | 6/1985 |
| JP | 03-114197 | 5/1991 |
| JP | 03-190088 | 8/1991 |
| JP | 5-101885 | * 4/1993 |
| JP | 06-290873 | 10/1994 |
| JP | 10-12377 | 1/1998 |
| JP | 10-092576 | 4/1998 |
| JP | 10-153967 | 6/1998 |
| JP | 10-308284 | 11/1998 |
| JP | 11-054270 | 2/1999 |
| JP | 2001-043980 | 2/2001 |
| WO | WO 90/13148 | 11/1990 |
| WO | WO 98/59528 | 12/1998 |
| WO | WO 99/25894 | 5/1999 |

OTHER PUBLICATIONS

Tsutsui et al.; "Electroluminescence in Organic Thin Films"; *Photochemical Processes in Organized Molecular Systems*; pp. 437-450; 1991.

M.A. Baldo et al.; "Highly Efficient Phosphorescent Emission from Organic Electroluminescent Devices"; *Nature*, vol. 395; pp. 151-154; Sep. 10, 1998.

M.A. Baldo et al.; "Very High-efficiency Green Organic Light-Emitting Devices Based on Electrophosphorescence"; *Applied Physics Letters*, vol. 75(1); pp. 4-6; Jul. 5, 1999.

Tsutsui et al.; "High Quantum Efficiency in Organic Light-Emitting Devices with Irdium-Comolex as a Triplet Emissive Center"; *Japan Journal of Applied Physics*, vol. 38(12B); pp. L1502-L1504; Dec. 15, 1999.

D.F. O'Brien et al.; "Improved Energy Transfer in Electrophosphorescent Devices"; *Applied Physics Letters*, vol. 74(3); pp. 443-444; Jan. 18, 1999.

Japan Patent Application Laid-Open No. 10-12377.

Japan Patent Application Laid-Open No. 10-153967.

Tsutsui et al.; "Electroluminescence in Organic Thin Films"; *Photochemical Processes in Organized Molecular Systems*; pp. 437-450; 1991.

M.A. Baldo et al.; "Highly Efficient Phosphorescent Emission from Organic Electroluminescent Devices"; *Nature*; vol. 395; pp. 151-154; Sep. 10, 1998.

M.A. Baldo et al.; "Very High-Efficiency Green Organic Light-Emitting Devices Based on Electrophosphorescence"; *Applied Physics Letters*, vol. 75(1); pp. 4-6; Jul. 5, 1999.

Tsutsui et al.; "High Quantum Efficiency in Organic Light-Emitting Devices with Irdium-Comolex as a Triplet Emissive Center"; *Japan Journal of Applied Physics*, vol. 38(12B); pp. L1502-L1504; Dec. 15, 1999.

Yamazaki, Shunpei; "Method of Fabricating an EL Display Device, and Apparatus for Forming a Thin Film", U.S. Appl. No. 09/619,486, filed Jul. 19, 2000; Specification, Claims, Drawings and Abstract.

Yamazaki, Shunpei et al., "Self-light Emitting Device and Method of Manufacturing the Same", U.S. Appl. No. 09/817,975, filed Mar. 27, 2001, Specification, Claims, Drawings and Abstract.

Eurodisplay '99, 19th International Display Research Conference, Sep. 6-9, 1999; pp. 33-37.

Search Report and Written Opinion (Singapore Patent Application No. 200105481-6), Feb. 4, 2005, 8 pages.

* cited by examiner

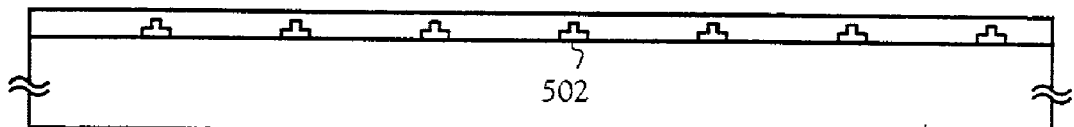
FIG. 5A
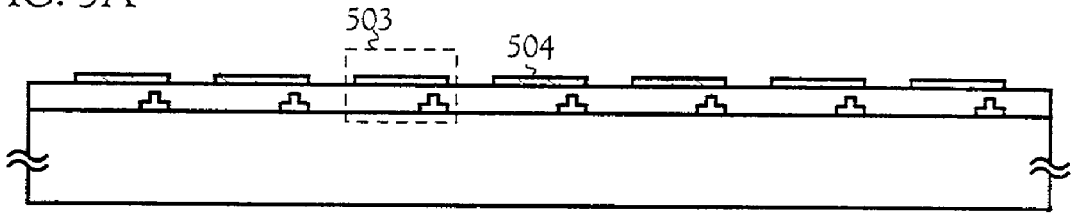
FIG. 5B
FIG. 5C
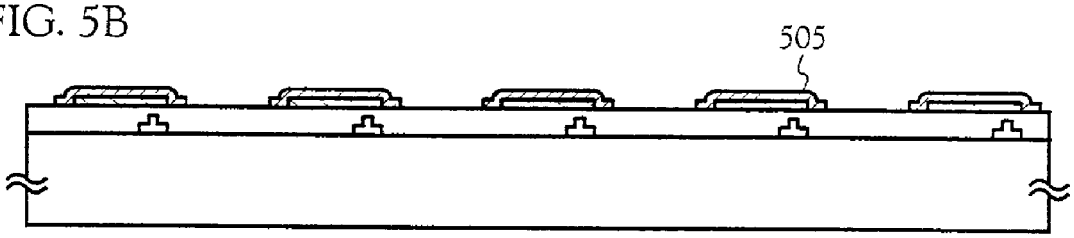
FIG. 5D
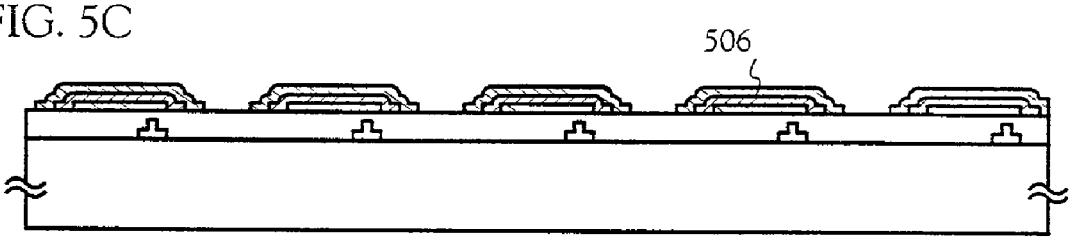
FIG. 5E
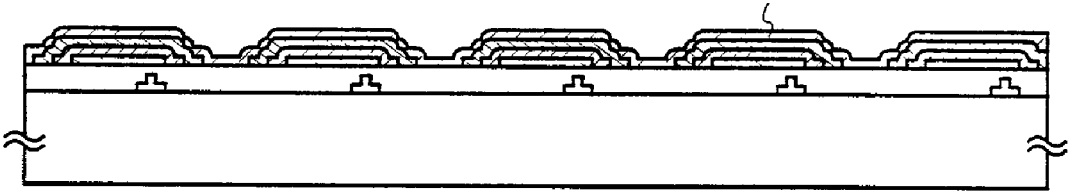
FIG. 5F
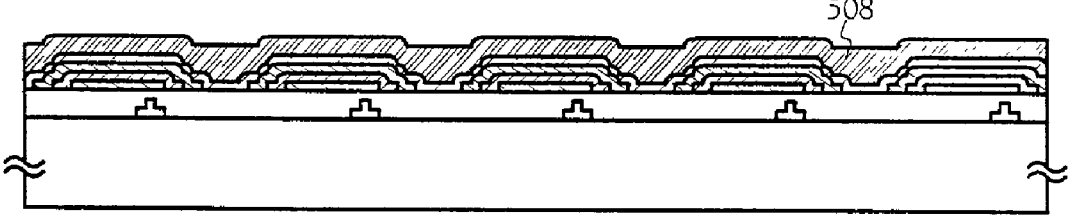

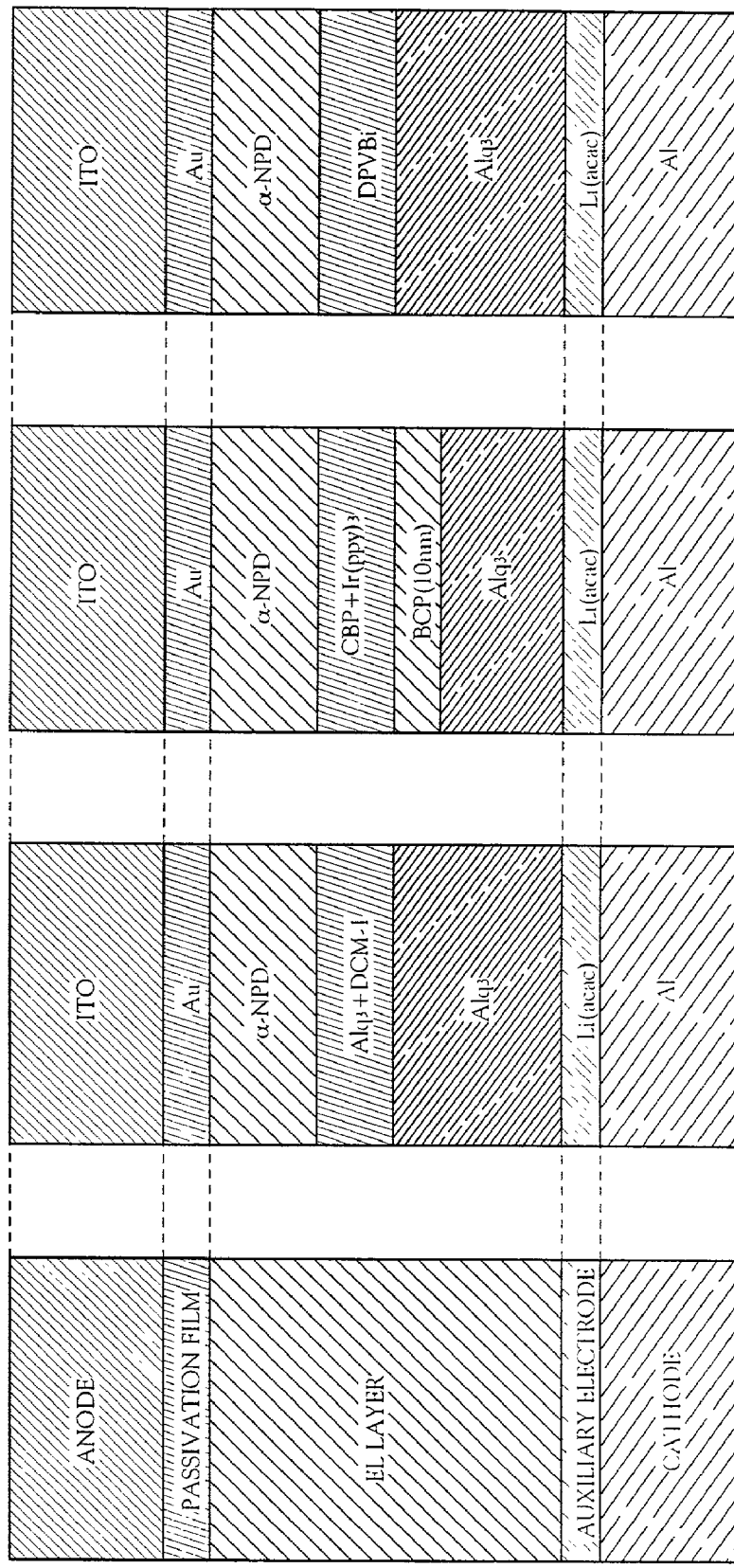
FIG. 7A  ELEMENT STRUCTURE
FIG. 7B  EL ELEMENT (RED)
FIG. 7C  EL ELEMENT (GREEN)
FIG. 7D  EL ELEMENT (BLUE)

LIGHT EMITTING DEVICE, METHOD OF MANUFACTURING THE SAME, AND THIN FILM FORMING APPARATUS

BACKGROUND OF THE INVENTION

1. Field of the Invention

The present invention relates to a thin film forming apparatus used in manufacturing a display device that has an EL (electroluminescence) element (the device will hereafter be called a light emitting device), to a method of manufacturing a light emitting device using the film forming apparatus, and to a light emitting device manufactured by the method.

2. Prior Art

Researches on a light emitting device having an EL element as a self-luminous element are flourishing in recent years. The one that attracts attention most is a light emitting device using an organic material as an EL material. The light emitting device is also called an organic EL display (OELD) or an organic light emitting diode (OLED).

The light emitting device is characterized by having no viewing-angle-related problem because it is self-luminous unlike liquid crystal display devices. This makes the light emitting device a more suitable display for outdoor use than liquid crystal displays, and various application modes for the light emitting device have been proposed.

An EL element is composed of a pair of electrodes and an EL layer sandwiched between the electrodes. The EL layer usually has a laminate structure typical example of which is one proposed by Tang et al. of Eastman Kodak Company and composed of a hole transporting layer, a light emitting layer, and an electron transporting layer. This structure has so high a light emitting efficiency that it is employed in almost all of light emitting devices that are under development at present.

When a given voltage is applied to the EL layer structured as above by a pair of electrodes, recombination of carriers takes place in the light emitting layer to emit light. On one hand, there is a passive matrix method in which EL layers are placed between one kind of striped electrode and the other kind of striped electrode which intersect with each other at right angles. On the other hand, there is an active matrix method in which EL layers are placed between pixel electrodes that are connected to TFTs and arranged in matrix and opposite electrodes.

A general EL element is formed such that it emits light toward a substrate side on which TFTs are formed when viewed from the EL element side (this is called a downward (bottom face) emission type).

In the downward emission type, a pixel electrode formed on a substrate that has TFTs formed on a quartz, glass or other insulating surface (hereinafter referred to as TFT substrate) is an anode, and is formed of a light-transmissive conductive film such as an alloy film of indium oxide and tin oxide (the alloy is called ITO) or a zinc oxide film. An EL layer is formed on the pixel electrode, and formed on the EL layer is an opposite electrode that serves as a cathode and is formed of a metal material having a small work function. Patterning of the pixel electrode is required in forming the pixel electrode and, in this case, patterning by photolithography is usually employed. The opposite electrode is formed by evaporation that damages the EL layer less.

SUMMARY OF THE INVENTION

A light emitting device having an EL element of the type that emits light toward the substrate side viewed from the EL element, namely, the downward emission type, is limited in aperture ratio because of the structure of the EL element. Then, expectedly, the aperture ratio is raised by using an EL element of the type that emits light toward the opposite side of the substrate viewed from the EL element (hereinafter referred to as an upward (top face) emission type).

The upward emission type EL element has an element structure reverse to that of the downward emission type EL element and is manufactured differently from the downward emission type. First, its pixel electrode formed on a TFT substrate serves as a cathode and cannot be patterned by photolithography unlike the case where the pixel electrode is an anode. Photolithography cannot be used because a conductive material of the cathode which has a small work function forms an oxide film to give an insulating surface to the pixel electrode.

On the other hand, if the pixel electrode is formed by evaporation using a metal mask, positioning of the metal mask having a fine mask pattern requires such a level of accuracy that has not quite been achieved yet. Therefore it is demanded to raise the accuracy in positioning the metal mask to pattern the pixel electrode by evaporation.

On the pixel electrode, an EL layer is formed. An EL material for forming the EL layer is extremely weak against oxidization and the slightest amount of moisture can easily accelerate the oxidization to degrade the EL material. Therefore a method of inhibiting degradation of the EL material is demanded.

On the EL layer, an opposite electrode is formed to serve as an anode. A light-transmissive conductive film for forming the anode is obtained by sputtering, which damages the EL layer enough to cause a problem. A method of forming the anode without damaging the EL layer is demanded.

The present invention has been made to meet those demands and an object of the present invention is therefore to provide a thin film forming apparatus that is most desirable in forming an EL element of upward emission type. Another object of the present invention is to provide a method of manufacturing a highly reliable light emitting device by using the thin film forming device. An electric apparatus that uses as its display unit a light emitting device obtained by the present invention is also included in the present invention.

The main purport of the present invention is to manufacture a light emitting device by using a multi-chamber type (also called a cluster tool type) or in-line type thin film forming apparatus integrating means for patterning a pixel electrode (cathode), means for forming a thin film of an EL material, and means for forming an opposite electrode (anode), which are required in forming an upward emission type EL element.

According to the present invention, the pixel electrode of the EL element is formed by evaporation and patterned into a desired pattern using a metal mask. When the evaporation is made using a metal mask of fine mask pattern, higher accuracy is required in positioning the metal mask with respect to a TFT substrate. Furthermore, it is important that the distance between the TFT substrate and the metal mask is shorter.

The present invention therefore places a CCD (charge coupled device) known as an image sensor in a film forming chamber for forming the pixel electrode. Using the CCD, the metal mask is positioned with respect to the TFT substrate with high accuracy and the distance between the mask and the substrate is set to a minimum. A pixel electrode having a fine pattern thus can be formed by evaporation.

When a surface of a metal film that forms the pixel electrode is oxidized, an oxide film is formed to render the pixel electrode insulating. Therefore an EL layer is formed without exposing the TFT substrate to the air after the pixel electrode is formed. The EL layer is formed in vacuum, for an EL material forming the EL layer is also weak against oxygen.

On the EL layer, an opposite electrode is formed from a light-transmissive conductive film but the EL layer could be damaged when the opposite layer is formed. The present invention solves this problem by forming as a passivation film a metal thin film having a high transmittance on the EL layer.

Then the opposite electrode serving as an anode is formed on the passivation film that covers the EL layer. Desirably, the passivation film and the opposite electrodes are also formed without being exposed to environment that contains moisture and oxygen. It is therefore desirable for the means of forming the passivation film and the opposite electrode to be mounted to the same thin film forming apparatus.

The present invention meets the above demands with a multi-chamber type thin film forming apparatus and involves a technique for manufacturing a highly reliable light emitting device by using the thin film forming apparatus.

BRIEF DESCRIPTION OF THE DRAWINGS

FIGS. 5A to 5F are diagrams showing a process of manufacturing an active matrix light emitting device of Embodiment 6;

FIGS. 7A to 7D are diagrams showing element structures in a light emitting device of Embodiment 1.

DETAILED DESCRIPTION OF THE PREFERRED EMBODIMENTS

Modes for carrying out the present invention will be described in detail through Embodiments below.

Embodiment 1

A thin film forming apparatus according to the present invention will be described with reference to FIG. 1. Shown in FIG. 1 is an apparatus for manufacturing a light emitting device to the point that an EL element composed of: a pixel electrode (cathode); an auxiliary electrode; an EL layer that includes a light emitting layer; a first passivation film; and an opposite electrode (anode) is formed on a TFT substrate, a second passivation film is formed on the EL element, and a sealing structure is completed.

Figure 1:
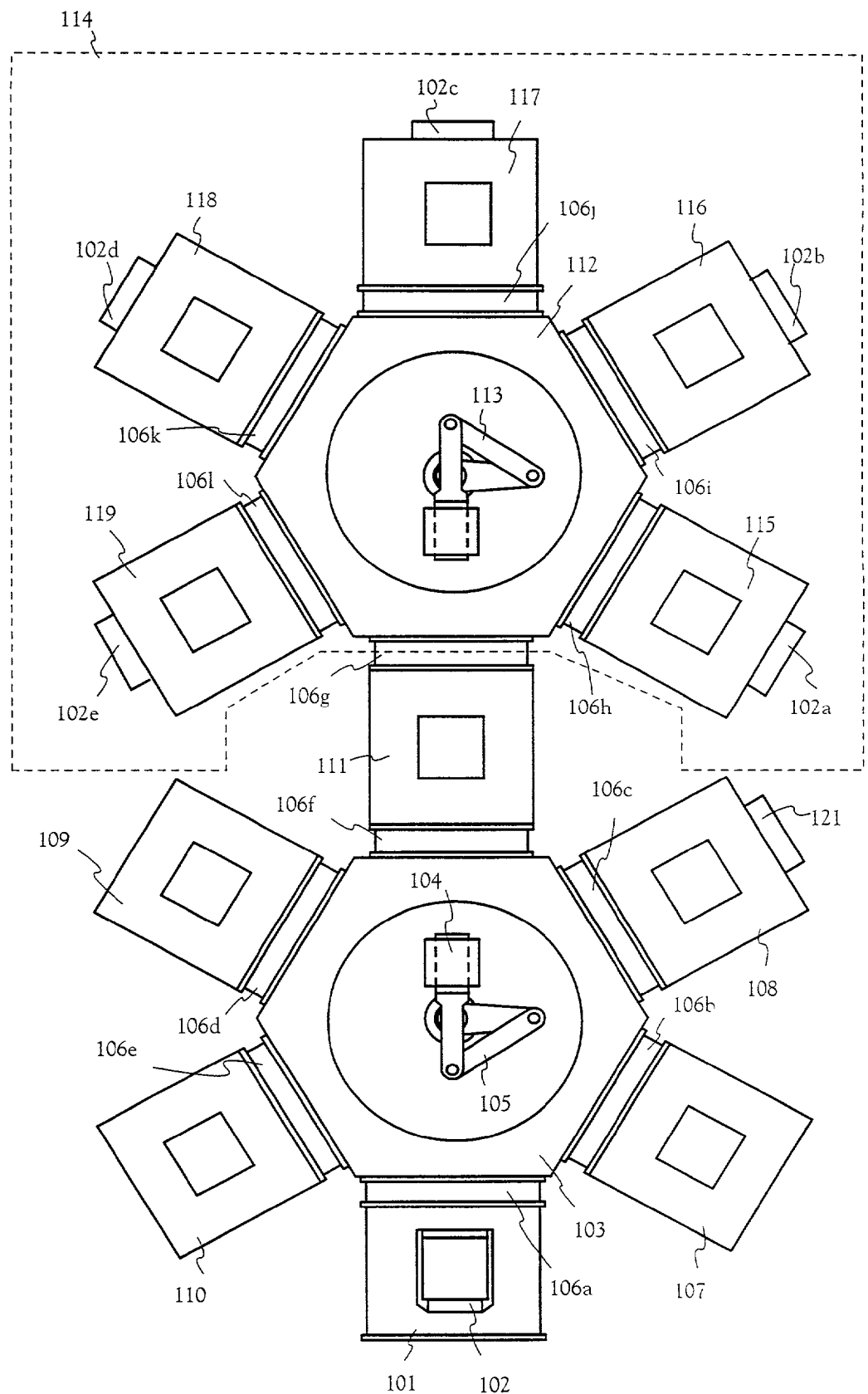
FIG. 1 is a diagram showing the structure of a thin film forming apparatus according to Embodiment 1.

In FIG. 1, reference numeral 101 denotes a loading chamber for bringing in or sending out a substrate. The loading chamber is also called a load lock chamber. A carrier 102 in which substrates are set is arranged in the loading chamber. The loading chamber 101 may be divided into a space for bringing a substrate in and a space for sending a substrate out.

Denoted by 103 is a first transferring chamber that includes a mechanism 105 for transferring a substrate 104 (hereinafter referred to as a first transferring mechanism). A robot arm for handling a substrate is a kind of the first transferring mechanism 105. Reference numeral 106a indicates a gate.

The first transferring chamber 103 is connected to a plurality of film forming chambers (denoted by 107 to 109) through gates 106b to 106d, and is connected to a processing chamber (a sealing chamber) 110 for sealing processing through a gate 106e. A gate 106f connects the first transferring chamber 103 to a second transferring chamber 111, which is connected to a third transferring chamber 112 through a gate 106g. The third transferring chamber 112 has a second transferring mechanism 113.

The third transferring chamber 112 is connected to a plurality of film forming chambers 115-119 for forming EL layers through gates 106h to 106l. These plural film forming chambers are called EL layer forming chambers 114 in this specification.

In the structure of FIG. 1, the film forming chambers, the transferring chambers, and the processing chamber are completely shut off to one another by the gates 106a to 106l. Therefore each chamber has an airtight space. The interior of the chambers is set to reduced pressure to obtain a vacuum atmosphere. Specifically, the pressure in the chambers is kept reduced at $1 \times 10^{-6}$ to $1 \times 10^{-5}$ Torr.

The vacuum state can be maintained by providing the film forming chambers, the transferring chambers, and the processing chamber with vacuum pumps. Usable vacuum pumps include an oil rotary pump, a mechanical booster pump, a turbomolecular pump, and a cryo pump. Of those pumps, a cryo pump is preferred because it is effective in removing moisture.

The chamber denoted by 107 is a metal material evaporation chamber for depositing a metal material by evaporation. There are two employable evaporation methods: one is to use resistive heating (resistivity evaporation method: RE method) and the other is to use electron beams (electron beam method: EB method). In this embodiment, a case of employing the RE method for evaporation will be explained. A pixel electrode electrically connected to a TFT on a substrate is thus formed in the metal material evaporation chamber 107. The pixel electrode formed in this embodiment is a cathode.

This means that the pixel electrode has to be formed from a metal element that is suitable to form a cathode, namely, a metal element high in reflectance and low in sheet resistance. This embodiment uses aluminum but other materials such as chromium or ITO that is an alloy of tin oxide and indium oxide may be used instead.

Yb that is a transition metal is also a material suitable for the pixel electrode (cathode) because a material having a small work function is preferred as the material of the pixel electrode. The pixel electrode may be formed by evaporation or sputtering. In this embodiment, evaporation is used to form the pixel electrode. When evaporation is made in the metal material evaporation chamber 107, an evaporation source (sample boat) has to be provided in the chamber. A plurality of evaporation sources may be provided.

Since the pixel electrode in this embodiment serves as a cathode, the pixel electrode has to be formed individually for each pixel that constitutes one EL element. However, aluminum or titanium easily forms an oxide film by its nature and patterning by photolithography is not suitable for an aluminum or titanium pixel electrode. Then this embodiment employs evaporation using a metal mask in the metal material evaporation chamber 107 to form a finely structured pixel electrode.

The metal material evaporation chamber 107 upon formation of the pixel electrode is set to a vacuum state, specifically, to $1 \times 10^{-6}$ to $1 \times 10^{-5}$ Torr and is kept to that state during film forming processing. The gate 106b is closed during the film forming processing to completely shut the evaporation chamber to the first transferring chamber 103, so that the pressure in the evaporation chamber is controlled.

When a pixel-size selective film formation is carried out using a metal mask and the metal mask has a fine pattern of about 10 to 100 μm, high accuracy is required in positioning the mask with respect to a TFT substrate.

For that reason, the present invention provides the metal material evaporation chamber 107 with a CCD as an alignment function for the positioning. Through the CCD, alignment marks respectively marked on the TFT substrate and the metal mask in advance are observed and positioning is made by moving a stage in the X axis direction, the Y axis direction, and the θ rotation direction such that the alignment marks coincide with each other. The stage as such is called an X-Y-θ stage in this specification.

Then an auxiliary electrode is formed from a metal material on the pixel electrode in the metal material evaporation chamber 107. A material having a small work function is usually used for the cathode, but this embodiment employs a material having a large work function such as Al for the cathode material. In order to reduce the work function of the cathode, the auxiliary electrode is formed on the pixel electrode. Formation of the auxiliary electrode also requires the use of the CCD in positioning, similar to the formation of the pixel electrode.

A metal material suitable for the auxiliary electrode is: a Group 1 element in the periodic table of long period elements, such as lithium, sodium, potassium, and cesium; a Group 2 element such as magnesium; or an oxide or fluoride of those elements. Being insulating, the oxide or fluoride is preferably formed thick to a degree that a tunnel current is generated, specifically, to a thickness of about 0.5 to 2 nm.

An organic metal film such as lithium acetylacetonate (Liacac) can also be used as the auxiliary electrode material. The film is conductive and hence causes no problem in terms of resistivity when it is formed to have a thickness of about 5 nm.

The cathode is composed of a laminate of the pixel electrode and the auxiliary electrode as described above, to thereby adjust the work function of the cathode to 2.5 to 4.0.

Therefore a sample boat of a metal material for forming the pixel electrode and a sample boat of a metal material for forming the auxiliary electrode have to be placed in the metal material evaporation chamber 107.

EL layers are formed next in the EL layer forming chambers 114 described in the above. In the EL layer forming chambers, a laminate including a hole injection layer, a hole transporting layer, a hole blocking layer, an electron transporting layer, and an electron injection layer in addition to a light emitting layer can also be formed. In this embodiment, organic materials for forming a hole injection layer, a hole transporting layer, a hole blocking layer, an electron transporting layer, and an electron injection layer, as well as a luminous material for forming a light emitting layer, are called EL materials. Here, the EL materials also include known metal complexes such as a tris (8-quinolinolate) aluminum complex (hereinafter referred to as $Alq_3$), a bis (benzoquinolinolate) beryllium complex (hereinafter referred to as $BeBq_2$), and a tris (2-phenylpyridine) iridium complex (hereinafter referred to as $Ir(ppy)_3$).

The film forming chambers of the EL layer forming chambers 114 respectively have on their side faces windows (102a to 102e) as means of observing how EL material deposition is going from the outside of the apparatus. The materials in the middle of deposition can be observed through the windows. This makes it possible to check whether the film formation is carried out normally. Each of the film forming chambers can have a plurality of evaporation sources so that a plurality of layers are formed in one film forming chamber. Specifically, it is preferable to set 1 through 8 different evaporation sources in each chamber.

The description given in this embodiment is of a case where a low molecular weight compound is used as the luminous material. A luminous material composed of a low molecular weight compound is preferably deposited by evaporation, and evaporation devices are therefore provided in the EL layer forming chambers 114. In this embodiment, other layers that constitute the EL layer than the light emitting layer are also formed by evaporation.

This embodiment describes a case in which a red light emitting EL layer (red EL layer), a green light emitting EL layer (green EL layer), and a blue light emitting EL layer (blue EL layer) are formed by evaporation in different film forming chambers.

The third transferring chamber 112 is connected to a red EL layer forming chamber 115 through the gate 106h, to a green EL layer forming chamber 116 through the gate 106i, and to a blue EL layer forming chamber 117 through the gate 106j. These EL layer forming chambers each have to be provided with a plurality of sample boats for storing different EL materials in order to form a laminate. Specifically, it is preferable to place 1 through 8 different sample boats in each chamber.

The red EL layer is formed first in the red EL layer forming chamber 115 of FIG. 1. In this embodiment, an electron transporting layer, a light emitting layer, and a hole transporting layer are formed in the red EL layer forming chamber 115.

First, $Alq_3$ is deposited as the electron transporting layer to a thickness of 20 nm by evaporation. The light emitting layer is formed next. In this embodiment, a low molecular weight red light emitting material is formed into a film by using a metal mask. The metal mask used is capable of selectively forming red light emitting layers at positions where red EL layers are to be formed (a metal mask for red). The red light emitting material used to obtain red light emission is $Alq_3$ doped with DCM-1. The thickness of the light emitting layer formed here is preferably 10 to 100 nm. In this embodiment, the light emitting layer is formed to have a thickness of 20 nm. The thickness of the light emitting layer may be adjusted suitably if necessary.

On the red light emitting layer, the hole transporting layer is formed of α-NPD by evaporation. The thickness of the hole transporting layer is preferably 20 to 80 nm. The hole transporting layer in this embodiment has a thickness of 40 nm to complete a laminate structure for the EL layer. The red EL layer is thus formed in the manner described above The green EL layer is formed next in the green EL layer forming chamber 116 of FIG. 1. Here, a material similar to the one used in forming the red EL layer is used to form an electron transporting layer, and a hole blocking layer is then formed from BCP. The thickness of the hole blocking layer is 20 nm.

Next, a green light emitting layer is formed. Used here is a metal mask capable of selectively forming green light emitting layers at positions where green EL layers are to be formed (a metal mask for green). The green light emitting material used to obtain green light emission is CBP and $Ir(ppy)_3$, which are deposited by co-evaporation. The thickness of the light emitting layer formed here is preferably 10 to 100 nm. In this embodiment, the light emitting layer is formed to have a thickness of 20 nm. The thickness of the light emitting layer may be adjusted suitably if necessary.

On the green light emitting layer, a hole transporting layer is formed from a material similar to the one used in forming the red EL layer, thereby completing the green EL layer.

Formed next in the blue EL layer forming chamber 117 of FIG. 1 is the blue EL layer. In this embodiment, an electron transporting layer is formed from a material similar to the one used in forming the red EL layer.

A blue light emitting layer is formed next. Used here is a metal mask capable of selectively forming blue light emitting layers at positions where blue EL layers are to be formed (a metal mask for blue). The blue light emitting material used to obtain blue light emission is DPVBi that is a distyryl derivative and is deposited by evaporation. The thickness of the light emitting layer formed here is preferably 10 to 100 nm. In this embodiment, the light emitting layer is formed to have a thickness of 20 nm. The thickness of the light emitting layer may be adjusted suitably if necessary.

On the blue light emitting layer, a hole transporting layer is formed from a material similar to the one used in forming the red EL layer, thereby completing the blue EL layer.

Through the above steps, EL elements respectively having red, green, and blue EL layers are obtained. Element structures of the EL elements formed in accordance with this embodiment are shown in FIGS. 7A to 7D. FIG. 7A shows the basic element structure. FIG. 7B shows specific materials used to form the EL element having the red EL layer, FIG. 7C shows specific materials used to form the EL element having the green EL layer, and FIG. 7D shows specific materials used to form the EL element having the blue EL layer. However, the present invention is not limited to these structures. For instance, the $Alq_3$+DCM-1 layer in the element of FIG. 7B may be replaced by a layer of other materials, or completely erased so that the light emitting layer consists of a single layer of $Alq_3$.

Since luminous materials are extremely weak against moisture, the pressure in the EL layer forming chambers 114 has to be set such that a vacuum state is maintained during forming the EL layers. The vacuum state in the forming chambers is controlled by using the gates 106h to 106j to completely shut down communication between the forming chambers and the common chamber 112 except when the substrate is brought in and sent out of the forming chambers. The pressure during forming the EL layers has to be set to $1 \times 10^{-6}$ to $1 \times 10^{-5}$ Torr.

Luminous materials that can be used in the present invention are not limited to the ones given in the above but known materials can be used alone or in combination. It is also possible to use organic compounds that emit light utilizing triplet excitation energy (referred to as triplet compounds in this specification) in combination with usual luminous materials.

The third transferring chamber 112 is connected to a spare chamber 1 (118) through the gate 106k, and to a spare chamber 2 (119) through the gate 106l. The spare chambers may be used as EL layer forming chambers for forming EL layers of other colors than red, green, and blue, or as film forming chambers for forming EL materials into films by a method other than evaporation.

The EL layers shown in this embodiment have a laminate structure consisting of a hole transporting layer, a light emitting layer, and an electron transporting layer. However, one or more of a hole injection layer, an electron injection layer, and a hole blocking layer may be added to this laminate structure. Alternatively, an EL layer may be composed solely of a light emitting layer.

After each EL layer is formed, the TFT substrate is transferred back to the metal material evaporation chamber 107. In order to prevent damage to the EL layer when an anode is formed on the EL layer, a first passivation film is formed by evaporation through resistive heating and is placed between the EL layer and the anode.

The material of the first passivation film used in this embodiment has to be a metal material having high transmittance, for light generated in the EL layer is emitted toward the first passivation film. Furthermore, the material is required to have a large work function because the first passivation film in this embodiment is formed on the anode side when viewed from the EL layer.

The metal material for forming the first passivation film is specifically a conductive film that transmits a visible ray at a transmittance of 70 to 100% and has a work function of 4.5 to 5.5. A metal film is often opaque to a visible ray, and hence the thickness of the film is set to 0.5 to 20 nm (preferably 10 to 15 nm). The metal material used in this embodiment is preferably gold, silver, or platinum. The metal material for forming the first passivation film is also put in a sample boat in the metal material evaporation chamber.

The chamber denoted by 108 is a film forming chamber for forming a film by sputtering and is called a sputtering chamber. In this embodiment, an opposite electrode to serve as the anode is formed by sputtering. Usually, evaporation or sputtering is employed to form the opposite electrode. This embodiment chooses sputtering since the EL materials that have been used to form the EL layers have a heat resistance of about 100° C.

The interior of the film forming chamber during film formation is set to an argon atmosphere with oxygen added thereto. This makes it possible to control oxygen concentration in the film formed, thereby obtaining a low resistive film with high transmittance. The chamber 108 is shut to the first transferring chamber 103 through the gate 106c.

Similar to the EL layer forming chambers, the sputtering chamber 108 has on its side face a window 121 as means through which the film being formed can be observed from the outside of the apparatus. How the film formation is going can be observed through the window 121. This makes it possible to check whether the film formation is carried out normally.

The opposite electrode (anode) is formed from a light-transmissive conductive film that is low in resistivity and high in transmittance. A film low in resistivity means a film that has a sheet resistance of 50 Ω/□ or less. A light-transmissive conductive film high in transmittance means a film having 70% or higher transmittance. Specifically, ITO that is an alloy of indium oxide and tin oxide, an alloy of indium oxide and zinc oxide, IDIXO, and the like are used.

The sputtering chamber 108 may be set to a vacuum state by setting the pressure to $1 \times 10^{-6}$ to $1 \times 10^{-5}$ Torr, as in other film forming chambers. However, the film is formed under a pressure of $1 \times 10^{-3}$ to $5 \times 10^{-2}$ Torr. During the film formation processing, the chamber 108 is completely shut to the first transferring chamber 103 by the gate 106c to control the pressure in the chamber 108.

Next, the chamber connected to the first transferring chamber 103 through the gate 106d is a film forming chamber for forming a film by plasma CVD (chemical vapor deposition) and is called a CVD chamber. In this embodiment, a diamond-like carbon film (hereinafter referred to as DLC film) serving as a second passivation film is formed by CVD on the EL element that has been finished up through the formation of the opposite electrode.

In order to improve adhesion between the opposite electrode formed of ITO and the second passivation film formed of DLC, an insulating film such as a silicon oxide film, a silicon nitride film, or a silicon film is formed in the CVD chamber 109 before forming the second passivation film.

In this embodiment, the DLC film formed so as to cover the EL element is an amorphous film with diamond bonds ($sp^3$ bonds) and graphite bonds ($sp^2$ bonds) mixed therein. The DLC (diamond-like carbon) film exhibits a Raman spectrum distribution that has an asymmetric peak around 1550 $cm^{-1}$ and a shoulder around 1300 $cm^{-1}$, and has a hardness of 15 to 25 GPa when measured by a micro hardness tester. The DLC film has attributes similar to those of diamond, such as a great hardness, chemical inertness, transparency to light ranging from a visible ray to an infrared ray, and high electric resistance. The name is derived from this similarity. Having the above attributes and a dense structure, the DLC film does not transmit oxygen or moisture and hence is suitable as a protective film.

A dense DLC film can be formed by applying a negative self-bias voltage to the electrode and then depositing a material gas that is accelerated by the negative self-bias voltage on the anode of the EL element. The material gas may be hydrocarbon, for example, saturated hydrocarbon such as methane, ethane, propane, and butane, unsaturated hydrocarbon such as ethylene, or the gas may be aromatics such as benzene and toluene. It is also possible to use hydrocarbon halide in which one or more hydrocarbon molecules are substituted by halogen elements such as F, CL, and Br.

The sealing chamber 110 is connected to the first transferring chamber 103 through the gate 106e. In the sealing chamber 110, the final processing of enclosing the EL element in an airtight space is conducted. Specifically, the EL element formed on the TFT substrate is mechanically enclosed using a seal material (also called a housing member), or is enclosed using a thermally curable resin or a photosensitive resin.

Glass, ceramics, or a metal can be used as the seal material. However, the seal material has to be light-transmissive when light is emitted toward the seal material. The seal material is bonded to the substrate on which all of the above processing has been conducted using a thermally curable resin or a photosensitive resin, which is cured by heat treatment or ultraviolet light irradiation treatment to form an airtight space. A drying agent such as barium oxide may be placed in this airtight space.

Alternatively, a thermally curable resin or a photosensitive resin alone can enclose the EL element without using the seal material. In this case, a thermally curable resin or a photosensitive resin is provided so as to cover at least side faces of the substrate on which all of the above processing has been conducted, and is then cured. This prevents moisture from entering the EL element from the film interface.

The above processing including exhaustion, transferring, film formation, and others may be carried out by fully automatic computer control using a touch panel or a sequencer.

The thin film forming apparatus structured as above is best characterized in that the pixel electrode can be formed by evaporation on the TFT substrate with high accuracy owing to the positioning function utilizing the CCD, and that the first passivation film is formed on the EL layer to prevent damage to the EL layer when sputtering is used to form the anode on the EL layer.

The present invention is also characterized in that the film forming chambers for forming thin films to be formed on the TFT substrate are all mounted to the multi-chamber type thin film forming apparatus. Accordingly, the EL element can be formed without being exposed to the outside air even once since the step of forming the pixel electrode on the TFT substrate through the step of forming the opposite electrode.

As a result, the invention can manufacture with simple measures a light emitting device having an EL element that emits light from an EL layer toward the opposite side of a TFT substrate, namely, an EL element of upward emission type.

Embodiment 2

This embodiment shows a case of modifying a part of the thin film forming apparatus of FIG. 1. The explanation is given with reference to FIG. 2. To be specific, the modification consists of providing a vacuum exhaust processing chamber 201 between the first transferring chamber 103 and an EL layer forming chamber 203 so that processing is made under normal pressure (atmospheric pressure) only in the EL layer forming chamber. As to explanations of the other parts than the modified part, see Embodiment 1. Although the apparatus shown here has only one EL layer forming chamber, a plurality of EL layer forming chambers may be provided if necessary.

The case shown in Embodiment 1 is of setting the interior throughout the thin film forming apparatus to a vacuum state to form an EL layer in vacuum. However, if a high molecular weight (polymer) material is used to form an EL layer, the layer is formed in a chamber filled with inert gas under normal pressure, and the pressure difference between the EL layer forming chamber and the rest of the thin film forming apparatus has to be overcome in order to transfer a substrate into the EL layer forming chamber 203.

Therefore, in this embodiment, the pressure in the vacuum exhaust processing chamber 201 is reduced first to the same level of pressure as the first transferring chamber 103, and the gate 106d is opened in this state to bring the substrate in. After the gate 106d is closed, the vacuum exhaust processing chamber 201 is purged with inert gas until the pressure in the chamber 201 returns to normal pressure. Then a gate 202 is opened to transfer the substrate into the EL layer forming chamber 203. The substrate may be brought into the chamber while being placed on a stage or by means dedicated to this transfer.

After the EL layer forming step is completed, the gate 202 is opened to transfer the substrate back to the vacuum exhaust processing chamber 201, and vacuum exhaustion is conducted while the gate 202 and the gate 106d are closed. When the pressure in the vacuum exhaust processing chamber 201 is reduced in this way to the same level of reduced pressure as the first transferring chamber 103, the gate 106d is opened to send the substrate to the first transferring chamber 103.

With the above structure, the substrate can be handled in vacuum in all of the chambers except the EL layer forming chamber 203.

Embodiment 3

This embodiment describes a case of applying the present invention to an inline type thin film forming apparatus. The description is given with reference to FIG. 3. Basically, the apparatus of this embodiment is obtained by modifying the multichamber type thin film forming apparatus of FIG. 1 into an in-line type apparatus. Therefore see Embodiment 1 for explanations of processing chambers.

Figure 3:
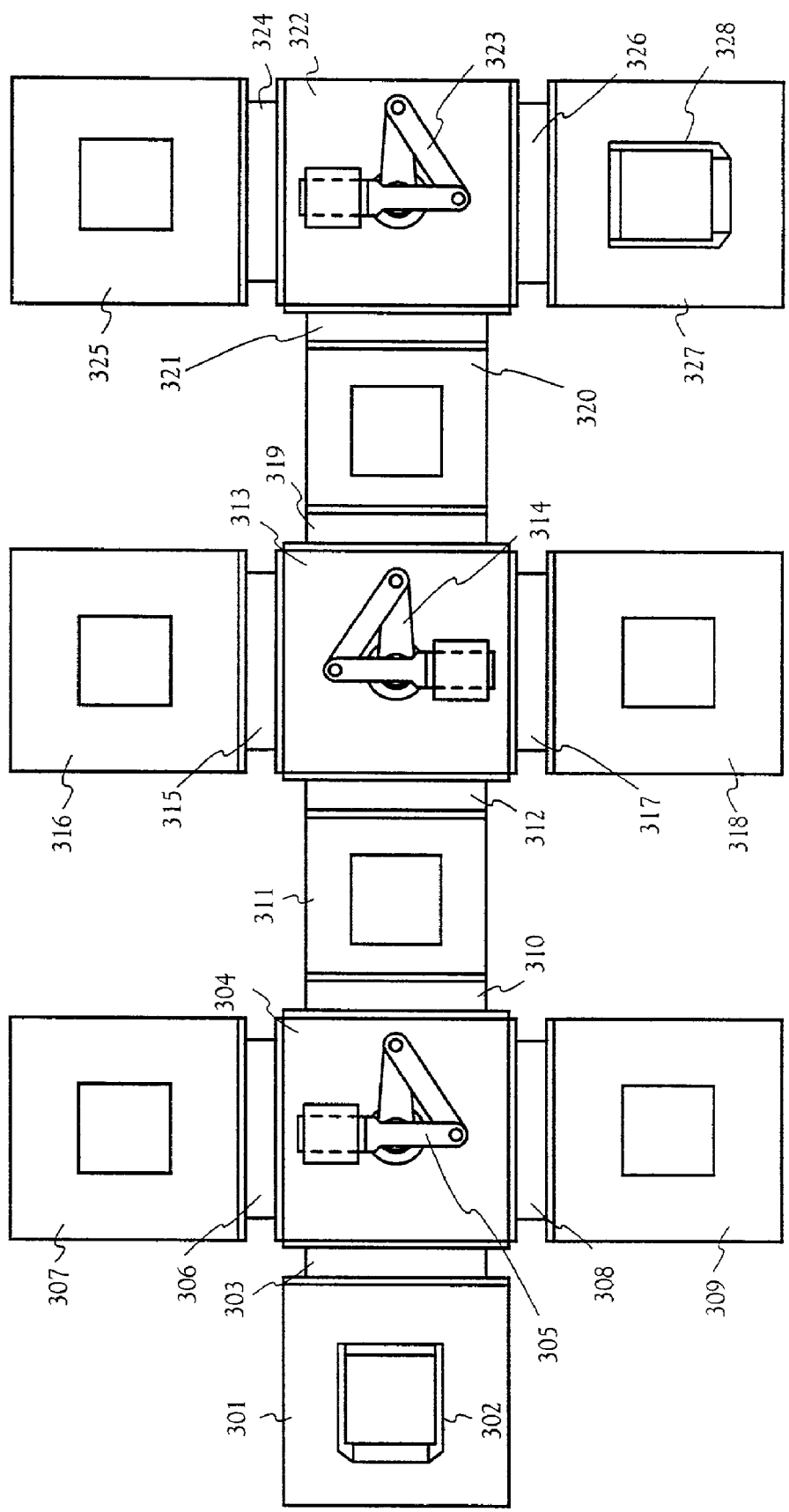
FIG. 3 is a diagram showing the structure of a thin film forming apparatus according to Embodiment 3.

In FIG. 3, reference symbol 301 denotes a loading chamber for bringing a TFT substrate in. A carrier 302 is set in the loading chamber 301. The loading chamber 301 is connected to a first transferring chamber 304 through a gate 303. The first transferring chamber 304 is provided with a first transferring mechanism 305. The first transferring chamber 304 is connected to a metal material evaporation chamber 307 through a gate 306, and to an EL layer forming chamber 309 through a gate 308.

A pixel electrode is formed in the metal material evaporation chamber 307 and an EL layer is formed in the EL layer forming chamber 309. A TFT substrate on which the pixel electrode and the EL layer are formed is brought to a second transferring chamber 311, which is connected to the chamber 304 through a gate 310. The second transferring chamber 311 is connected to a third transferring chamber 313 through a gate 312. The third transferring chamber 313 is provided with a second transferring mechanism 314, which brings the substrate out of the third transferring chamber 313.

The third transferring chamber 313 is connected to a sputtering chamber 316 through a gate 315, and to a CVD chamber 318 through a gate 317. An opposite electrode is formed on the substrate in the sputtering chamber 316 and the substrate then receives processing in the CVD chamber 318. Thereafter, the substrate is brought into a fourth transferring chamber 320, which is connected to the chamber 313 through a gate 319.

In the CVD chamber 318, a diamond-like carbon film (hereinafter referred to as DLC film) is formed on an EL element that has been finished up through formation of the opposite electrode in the sputtering chamber 316. In order to improve adhesion between the opposite electrode and the DLC film, an insulating film containing silicon, such as a silicon oxide film or a silicon nitride film is formed on the opposite electrode in this embodiment before the DLC film is formed.

The fourth transferring chamber 320 is connected to a fifth transferring chamber 322 through a gate 321. The fifth transferring chamber 322 is provided with a third transferring mechanism 323, which brings the substrate out of the fourth transferring chamber 320. The fifth transferring chamber 322 is connected to a sealing chamber 325 through a gate 324, and to an unloading chamber 327 through a gate 326.

In this embodiment, the TFT substrate on which the DLC film as a protective film of the EL element is formed is sealed using a seal or the like in the sealing chamber 325.

The fifth transferring chamber 322 is connected to the unloading chamber 327 for transferring out the substrate through the gate 326. A carrier 328 is set in the unloading chamber 327. The carrier 328 stores TFT substrates that have undergone all of processing conducted by the thin film forming apparatus.

As described above, the thin film forming apparatus shown in this embodiment is an in-line type apparatus in which a plurality of film forming chambers and a sealing chamber are connected to conduct a successive processing up through enclosing of an EL element.

Embodiment 4

This embodiment shows another case of applying the present invention to an in-line type thin film forming apparatus. The apparatus of this embodiment is different from the one shown in FIG. 3 in that all processing chambers are connected in series and no transferring chamber is provided between adjacent processing chambers. The description is given with reference to FIGS. 4A and 4B. Basically, the apparatus of this embodiment is obtained by modifying the multi-chamber type thin film forming apparatus of FIG. 1 into an in-line type apparatus. Therefore see Embodiment 1 for explanations of the processing chambers.

Figure 4A:
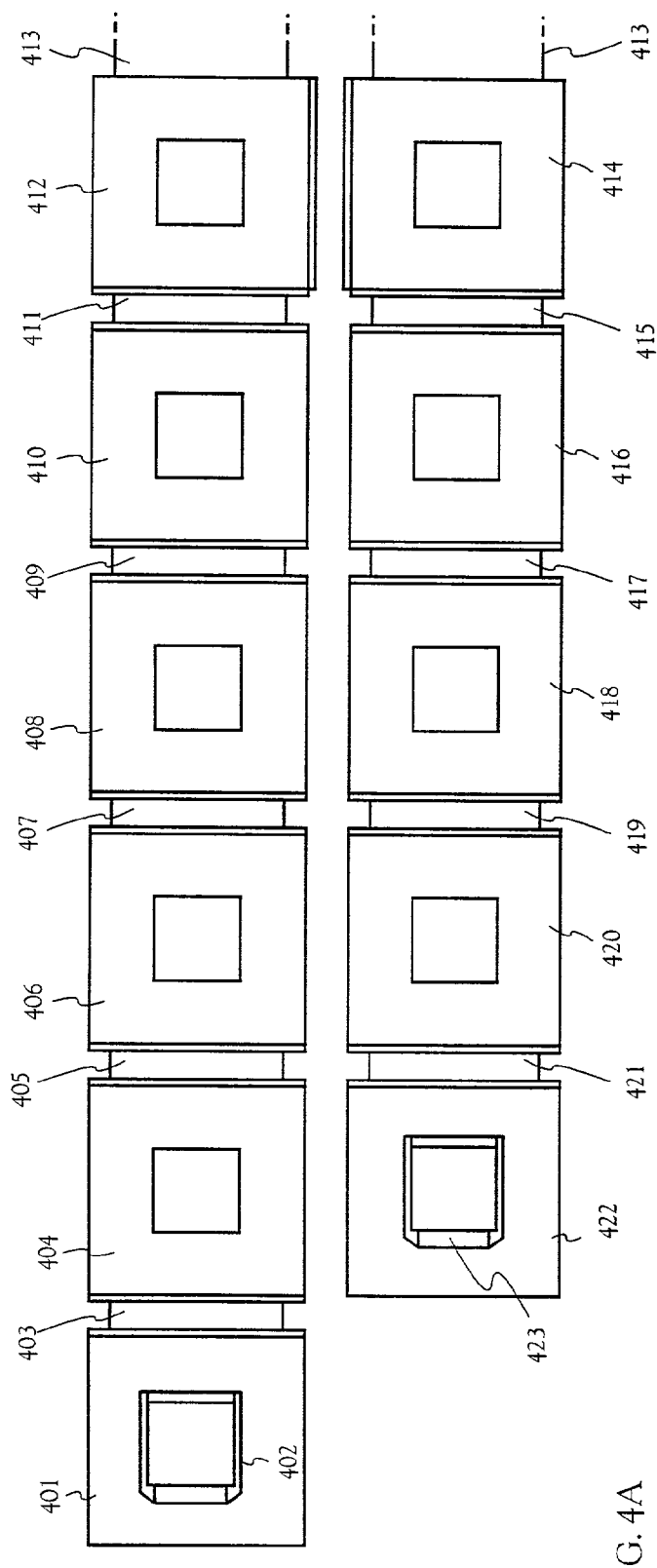
FIGS. 4A and 4B are diagrams showing the structure of a thin film forming apparatus according to Embodiment 4.

In FIG. 4A, reference symbol 401 denotes a loading chamber for bringing a TFT substrate in. A carrier 402 is set in the loading chamber 401. The loading chamber 401 is connected to a metal material evaporation chamber 1 (404) through a gate 403, and to a metal material evaporation chamber 2 (406) through a gate 405.

A pixel electrode is formed in the metal material evaporation chamber 1 (404) and an auxiliary electrode is formed in the metal material evaporation chamber 2 (406). A TFT substrate on which the pixel electrode and the auxiliary electrode are formed is then moved to EL layer forming chambers. Connected to the metal material evaporation chamber 2 (406) through a gate 407 is a green EL layer forming chamber 408, which is connected through a gate 409 to a red EL layer forming chamber 410, which is connected to a blue EL layer forming apparatus 412 through a gate 411. The green EL layer forming chamber 408, the red EL layer forming chamber 410, and the blue EL layer forming chamber 412 are generically called EL layer forming chambers in this embodiment.

The blue EL layer forming chamber 412 is connected through a gate 413 to a metal material evaporation chamber 3 (414), which is connected through a gate 415 to a sputtering chamber 416, which is connected to a CVD chamber 418 through a gate 417. In FIG. 4A, only a part of the gate 413 connected to the EL layer forming chamber 412 is shown due to lack of space but the gate 413 is actually connected to the metal material evaporation chamber 3 (414) in linear series.

After the processing in the CVD chamber 418 is finished, the substrate is processed in a sealing chamber 420 that is connected to the chamber 418 through a gate 419. Then the substrate is brought into an unloading chamber 422 that is connected to the chamber 420 through a gate 421, and is stored in a carrier 423 in the chamber 422.

Figure 4B:
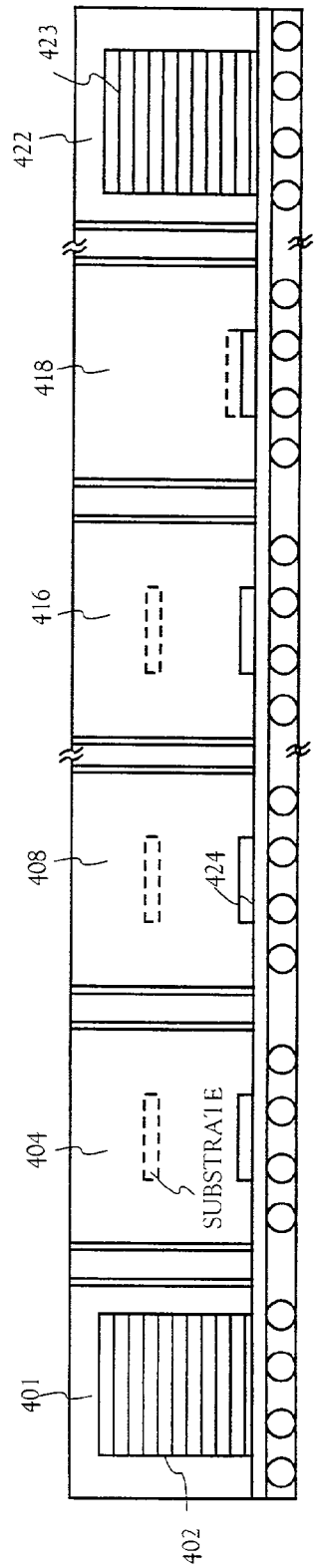

FIG. 4B shows a sectional structure of the apparatus shown in FIG. 4A. Since no transferring chamber nor transferring mechanism is provided between the film forming chambers or the processing chambers in this embodiment, the TFT substrate is moved from one chamber to another chamber while being set on a stage 424. The symbols used in FIG. 4B are the same as those in FIG. 4A so that they are cross-referred.

According to the thin film forming apparatus shown in this embodiment, a plurality of film forming chambers and a sealing chamber are connected to conduct a successive processing up through enclosing of an EL element with high throughput.

Embodiment 5

In the examples given in Embodiments 1 through 4, the plural processing chambers include a metal evaporation chamber, an EL layer forming chamber, a sputtering chamber, a CVD chamber, and a sealing chamber. However, the present invention is not limited to this combination. Two or more sputtering chambers may be provided and plural other film forming chambers may be provided if necessary.

It is also effective to form as a last passivation film an insulating film, preferably an insulating film containing silicon, or a DLC film after an EL element is sealed so as to cover the EL element as shown in Embodiment 4. A desirable insulating film containing silicon is a silicon nitride film or a silicon nitride oxide film whose oxygen content is small.

As described above, the combination of the plural processing chambers is not limited in the present invention, and what kind of functions the processing chambers to have can be set at one's discretion. For explanations of these processing chambers, see Embodiment 1.

Embodiment 6

This embodiment shows a case in which a thin film forming apparatus according to the present invention is used to manufacture an active matrix light emitting device. The description will be given with reference to FIGS. 5A to 5F. The description in this embodiment is made taking as an example the apparatus explained in Embodiment 1. Accordingly, see explanations in Embodiment 1 for details of the film formation conducted in the respective film forming chambers.

As shown in FIG. 5A, TFTs 502 are formed first on a glass substrate 501. The TFTs 502 of pixels 503 can be fabricated by a known TFT fabrication method. Of course, the TFTs 502 may either be top gate TFTs or bottom gate TFTs.

A TFT substrate shown in FIG. 5A is set in the carrier 102, which is placed in the loading chamber 101 of the thin film forming apparatus shown in FIG. 1.

The first transferring mechanism 105 transfers the TFT substrate to the metal material evaporation chamber 107, where pixel electrodes 504 are formed. In this embodiment, a metal mask is positioned with respect to the TFT substrate using a CCD provided in the film forming chamber that is exhausted into a vacuum state, and a film mainly containing aluminum is used to form the pixel electrodes 504. The pixel electrodes 504 function as reflective electrodes because light generated from an EL element is emitted toward the opposite side of the TFT substrate (upward in FIG. 5A) in this embodiment. Accordingly, a material having higher reflectance is preferred for the pixel electrodes.

In this way, the pixels 503 having the TFTs 502 and the pixel electrodes (cathodes) 504 are arranged in matrix as shown in FIG. 5B. The TFTs 502 control the amount of current flowing into the pixel electrodes 504.

In the metal material evaporation chamber 107, a metal mask is positioned with respect to the TFT substrate using the CCD provided in the chamber, similar to the formation of the pixel electrodes 504. Thereafter, auxiliary electrodes 505 are selectively formed on the pixel electrodes 504 by evaporation. The material used here for the auxiliary electrodes is lithium acetylacetonate (Liacac).

After the state of FIG. 5C is obtained, the first transferring mechanism 105 transfers the TFT substrate to the second transferring chamber 111. The second transferring mechanism 113 sends the TFT substrate to the third transferring chamber 112 and then to the red EL layer forming chamber 115, where red light emitting layers are formed by evaporation using a metal mask.

Next, the second transferring mechanism 113 sends the TFT substrate to the green EL layer forming chamber 116, where green light emitting layers are formed by evaporation using a metal mask.

The second transferring mechanism 113 then sends the TFT substrate to the blue EL layer forming chamber 117, where blue light emitting layers are formed by evaporation using a metal mask. The red, green, and blue light emitting layers are formed through the above steps. In this embodiment, each EL layer 506 consists of a single layer of light emitting layer (FIG. 5D).

After the state of FIG. 5D is obtained, the TFT substrate is sent back to the metal material evaporation chamber 107 to form a first passivation film 507 from a metal film having a large work function by evaporation. In this embodiment, a gold (Au) film with a thickness of 5 nm is formed (FIG. 5E).

The TFT substrate on which the first passivation film 507 is formed is transferred from the metal material evaporation chamber 107 to the sputtering chamber 108 by the first transferring mechanism 105. In the sputtering chamber, an opposite electrode is formed on the first passivation film 507 from a light-transmissive conductive film containing a compound of indium oxide and tin oxide (the compound is called ITO) or a compound of indium oxide and zinc oxide.

An opposite electrode (anode) 508 in this embodiment is formed from a compound in which 10 to 15% of zinc oxide is mixed with indium oxide. The state of FIG. 5F is thus obtained.

Thereafter, the first transferring mechanism 105 takes the TFT substrate on which the opposite electrode 508 is formed out of the sputtering chamber 108 and sends it to the CVD chamber 109. A second passivation film (not shown) may be formed in the CVD chamber by plasma CVD from an insulating material containing silicon, such as silicon nitride or silicon oxide, if necessary.

The TFT substrate on which the second passivation film is formed is transferred from the CVD chamber 109 to the sealing chamber 110 by the first transferring mechanism 105. In the sealing chamber, sealing is made using a seal material such as a glass substrate and a plastic substrate.

Shown in this embodiment is a case in which a thin film forming apparatus of the present invention is used to manufacture an active matrix light emitting device. However, the apparatus of the present invention can also be used to manufacture a passive matrix light emitting device. The structure of this embodiment may be obtained by any thin film forming apparatus of Embodiments 1 through 5.

Embodiment 7

This embodiment shows another case in which a thin film forming apparatus according to the present invention is used to manufacture an active matrix light emitting device. The description will be given with reference to FIGS. 6A to 6F. The description in this embodiment is made taking as an example the apparatus explained in Embodiment 2. Accordingly, see explanations in Embodiment 2 for details of the film formation conducted in the respective film forming chambers.

Figure 6A:
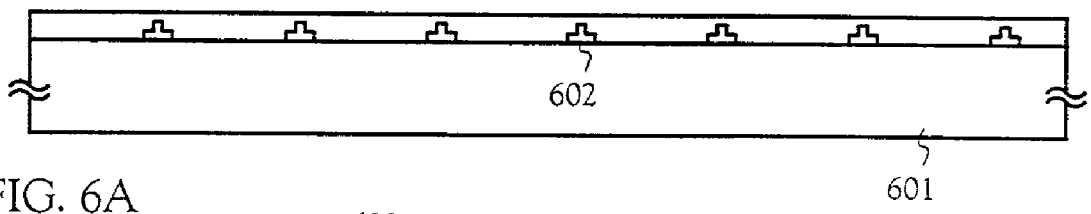
FIGS. 6A to 6F are diagrams showing a process of manufacturing an active matrix light emitting device of Embodiment 7.

As shown in FIG. 6A, TFTs 602 are formed on a glass substrate 601. Although a glass substrate is employed in this embodiment, any material can be used for the substrate. The TFTs 602 can be fabricated by a known TFT fabrication method. Of course, the TFTs 602 may either be top gate TFTs or bottom gate TFTs.

Figure 2:
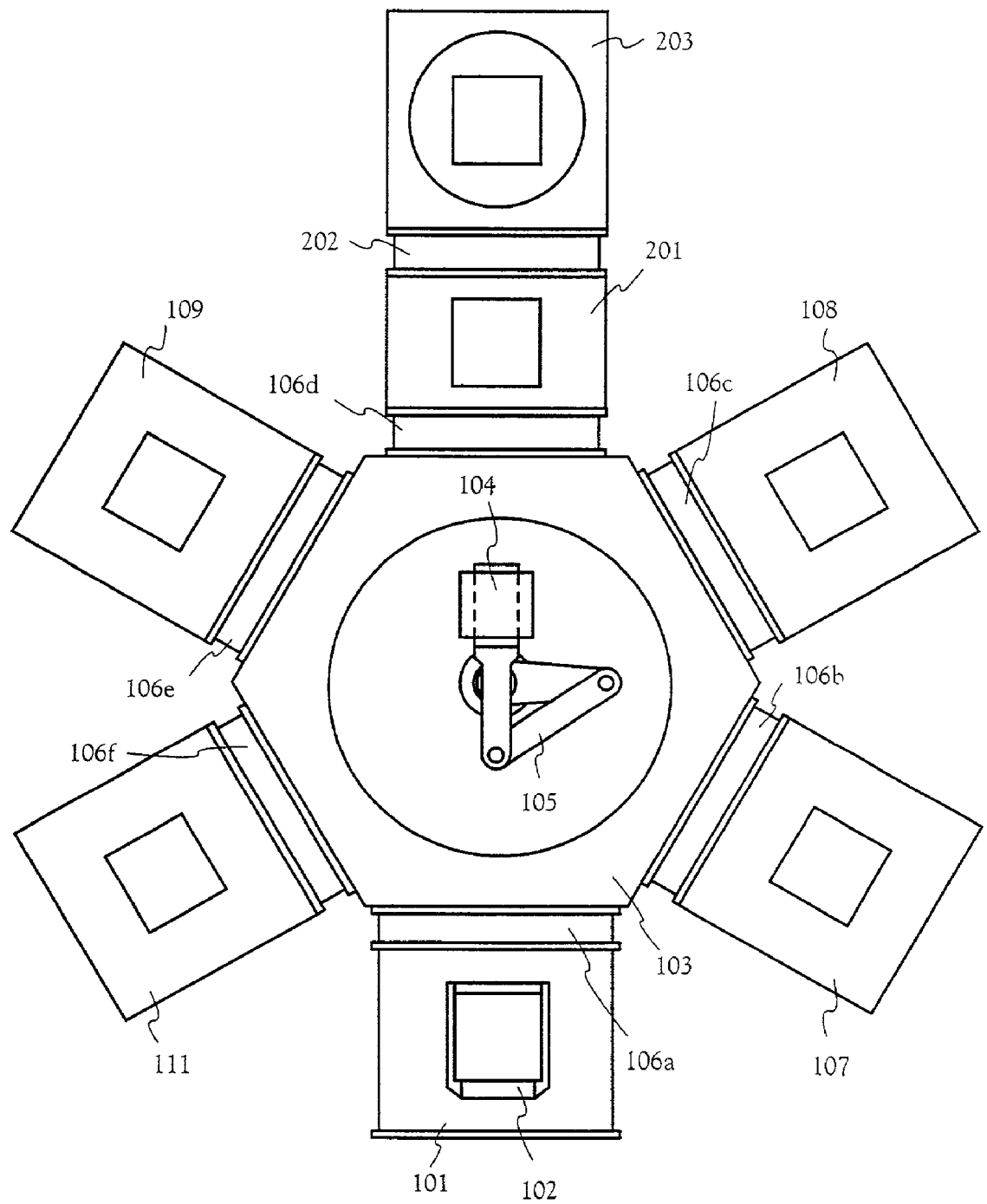
FIG. 2 is a diagram showing the structure of a thin film forming apparatus according to Embodiment 2.

A TFT substrate shown in FIG. 6A is set in the carrier 102, which is placed in the loading chamber 101 of the thin film forming apparatus shown in FIG. 2.

The transferring mechanism 105 transfers the TFT substrate to the metal material evaporation chamber 107, where pixel electrodes (cathodes) 604 are formed. The pixel electrodes 604 are formed from a film mainly containing aluminum. The pixel electrodes 604 function as reflective electrodes because light generated from an EL element is emitted toward the opposite side of the TFT substrate (upward in FIG. 6A) in this embodiment. Accordingly, an aluminum (Al) film with a thickness of 60 nm is used as a material having high reflectance.

Figure 6B:
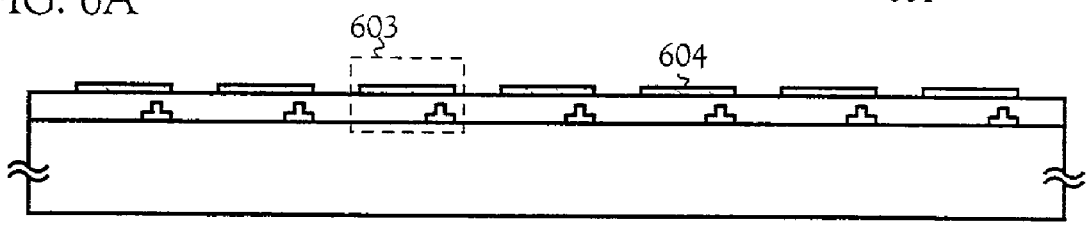

In this way, pixels 603 having the TFTs 602 and the pixel electrodes (cathodes) 604 are arranged in matrix as shown in FIG. 6B. The TFTs 602 control the amount of current flowing into the pixel electrodes 604.

In the metal material evaporation chamber 107, a metal mask is positioned with respect to the TFT substrate using a CCD provided in the chamber, similar to the formation of the pixel electrodes 604. Thereafter, auxiliary electrodes 605 are selectively formed on the pixel electrodes 604 by evaporation. The material used in this embodiment for the auxiliary electrodes is lithium fluoride (LiF), which is formed into a film 0.5 nm in thickness.

Figure 6C:
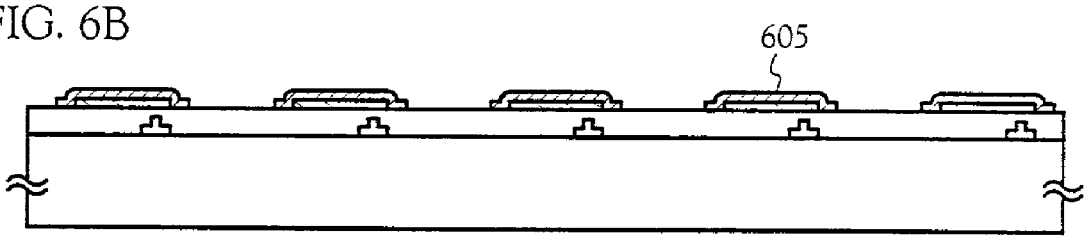

After the state of FIG. 6C is obtained, the TFT substrate is transferred to the vacuum exhaust processing chamber 201 and then the gate 106d is closed. The pressure in the vacuum exhaust processing chamber 201 is changed to normal pressure (atmospheric pressure). Then the gate 202 is opened to bring the substrate into the EL layer forming chamber 203, where a solution containing a high molecular weight EL material is applied to the substrate by spin coating. In this embodiment, a hole injection layer with a thickness of 30 nm is formed first from an aqueous solution obtained by dissolving PEDOT that is a polythiophene derivative in water. Next, a solution with polyphenylene vinylene (PPV) dissolved in dichloromethane is applied to form a film having a thickness of 80 nm. Other combinations of high molecular weight EL materials and organic solvents may of course be employed (FIG. 6D).

Once EL layers 606 are formed, the TFT substrate is sent back to the vacuum exhaust processing chamber 201. The gate 202 is closed and then the vacuum exhaust processing chamber 201 is set to a vacuum state. When the pressure in the vacuum exhaust processing chamber 201 reaches the same level of pressure as the first transferring chamber, the gate 106d is opened and the transferring mechanism 105 takes out the TFT substrate.

Figure 6D:
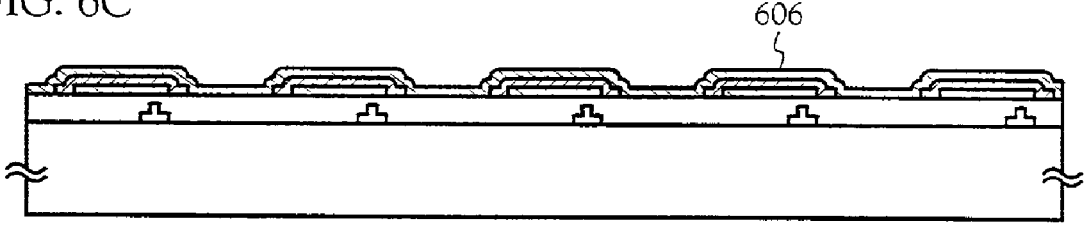
Figure 6E:
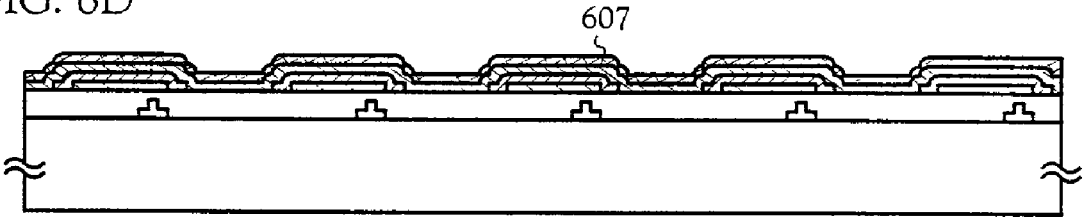

After the state of FIG. 6D is obtained, the TFT substrate is sent back to the metal material evaporation chamber 107 to form a first passivation film 607 from a metal film having a small work function by evaporation. In this embodiment gold (Au) is used to form the first passivation film (FIG. 6E).

The TFT substrate on which the first passivation film 607 is formed is transferred from the metal material evaporation chamber 107 to the sputtering chamber 108 by the transferring mechanism 105. In the sputtering chamber 108, an opposite electrode 608 is formed on the first passivation film 607 from a light-transmissive conductive film containing a compound of indium oxide and tin oxide (the compound is called ITO) or a compound of indium oxide and zinc oxide.

Figure 6F:
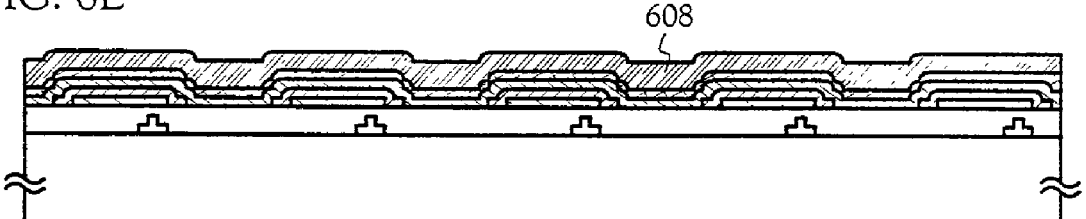

An opposite electrode (anode) 608 in this embodiment is formed from a compound in which 10 to 15% of zinc oxide is mixed with indium oxide. The state of FIG. 6F is thus obtained.

Thereafter, the transferring mechanism 105 takes the TFT substrate on which the opposite electrode 608 is formed out of the sputtering chamber 108 and sends it to the CVD chamber 109. A second passivation film (not shown) may be formed in the CVD chamber by plasma CVD from an insulating material containing silicon, such as silicon nitride or silicon oxide, if necessary.

The TFT substrate on which the second passivation film is formed is transferred from the CVD chamber 109 to the sealing chamber 110 by the transferring mechanism 105. In the sealing chamber, sealing is made using a seal material such as a glass substrate and a plastic substrate.

Shown in this embodiment is a case in which a thin film forming apparatus of the present invention is used to manufacture an active matrix light emitting device. However, the apparatus of the present invention can also be used to manufacture a passive matrix light emitting device. The structure of this embodiment may be obtained by any thin film forming apparatus of Embodiments 1 through 5.

Embodiment 8

This embodiment describes a method of forming a metal mask that is used to form a pixel electrode in a film forming apparatus according to the present invention.

One of techniques for forming a metal mask is an etching method in which a resist on a metal plate such as a stainless steel plate is patterned and etching is made with an appropriate etchant from both sides. However, forming 100 µm spacing patterns on a 100 µm thick stainless steel substrate is the farthest the method can afford.

Accordingly, a metal mask used in the present invention is one formed by electrotyping. To be specific, a resist is formed to a thickness of 25 to 50 µm on an electrodeposit metal that serves as a case. Thereafter, a pattern is burnt onto the resist using a negative pattern film. The pattern is developed to form a patterned resist.

On the patterned resist, a metal thin film is grown to a thickness of about 10 µm by electroless plating. The resist is then removed and the metal thin film is taken out of the case. A metal mask having a fine pattern is thus formed.

When the metal mask is used to form a film, the distance between the metal mask and a TFT substrate has to be kept small. The present invention therefore employs a magnet set in a stage on which the TFT substrate is placed, so that the metal mask is held close to the TFT substrate by magnetic force. This can prevent a defective pattern due to bending or shift of the metal mask.

For that reason, stainless steel, nickel, or chromium is preferably used for the metal mask formed in accordance with the present invention. By using the metal mask formed as above, an evaporation pattern of 10 µm or less spacing can be formed on the TFT substrate. The structure of this embodiment may be combined freely with any of the structures of Embodiments 1 through 5.

Embodiment 9

The light-emitting display device of the present invention, is a self light emitting type, therefore compared to a liquid crystal display device, it has excellent visible properties and is broad in an angle of visibility. Accordingly, the light-emitting display device can be applied to a display portion in various electronic devices.

As other electronic equipments of the present invention there are: a video camera; a digital camera; a goggle type display (head mounted display); a car navigation system; a sound reproduction device (a car audio stereo and an audio set and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk player (DVD), and displays the images). In particular, in the case of the portable information terminal, use of the light emitting device having an EL element is preferable, since the portable information terminal that is likely to be viewed from a tilted direction is often required to have a wide viewing angle. Specific examples of those electronic equipments are shown in FIGS. 8A-8H.

Figure 8A:
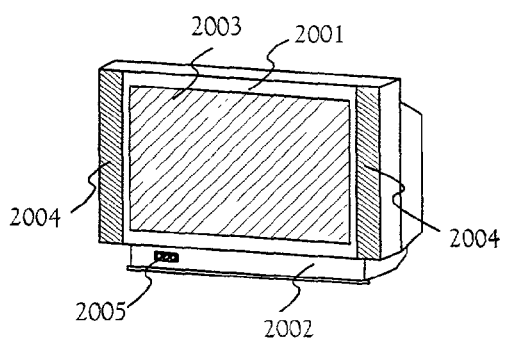
FIGS. 8A to 8H are diagrams showing examples of electric apparatuses of Embodiment 9.

FIG. 8A shows a display device containing a casing 2001, a support stand 2002, and a display portion 2003, the speaker portion 2004 and the video input terminal 2005. The light-emitting device of the present invention can be used as the display portion 2003. Such a light-emitting device having an EL element is a self light emitting type so that a back light is not necessary. Thus, the display portion can be made thinner than that of a liquid crystal display. Further the light-emitting device is including all information display device such as for a personal computer, for a TV broadcasting and for an advertisement.

Figure 8B:
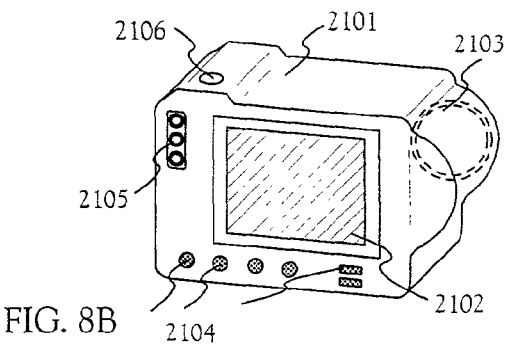

FIG. 8B shows a digital still camera, and contains a main body 2101, a display portion 2102, an image receiving portion 2103, operation keys 2104, an external connection port 2105, and shutter 2106. The light-emitting device of the present invention can be used as the display portion 2102.

Figure 8C:
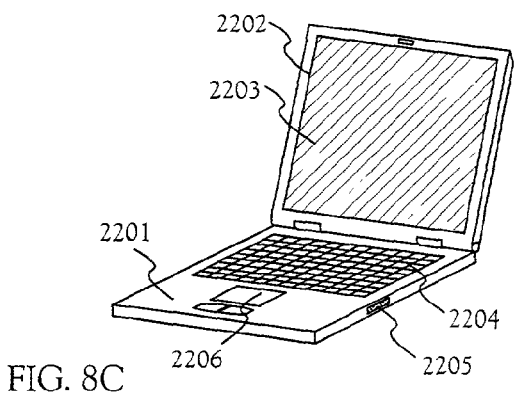

FIG. 8C shows a note type personal computer, and contains a main body 2201, a casing 2202, a display portion 2203, a keyboard 2204, an external connection port 2205 and a pointing mouse 2206. The light-emitting device of the present invention can be used as the display portion 2203.

Figure 8D:
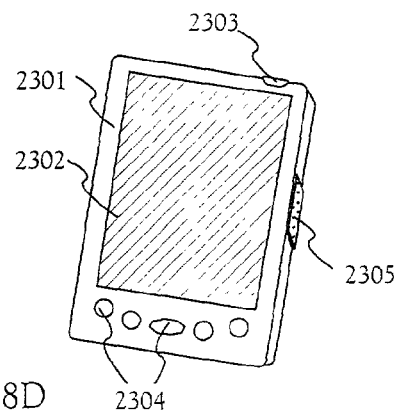

FIG. 8D shows a mobile computer, and contains a main body 2301, a display portion 2302, a switch 2303, an operation key 2304 and infrared port 2305. The light-emitting device of the present invention can be used as the display portion 2302.

Figure 8E:
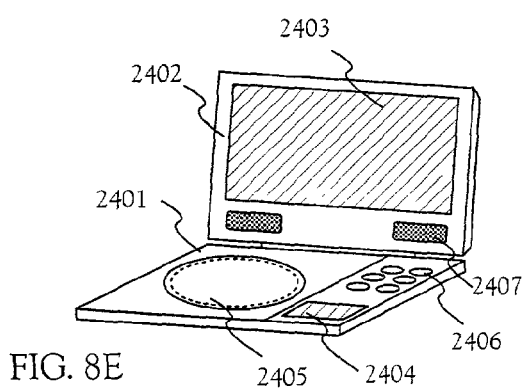

FIG. 8E is an image playback device equipped with a recording medium (specifically, a DVD playback device), and contains a main body 2401, a casing 2402, a display portion (A) 2403, a display portion (B) 2404, a recording medium (such as a DVD and so forth) read portion 2405, operation keys 2406, a speaker portion 2407. The display portion (A) 2403 is mainly used for displaying image information. The display portion (B) 2404 is mainly used for displaying character information. The electronic device and the driving method of the present invention can be used as the display portion (A) 2403 and as the display portion (B) 2404. Note that the image playback device equipped with the recording medium includes devices such as domestic game machines.

Figure 8F:
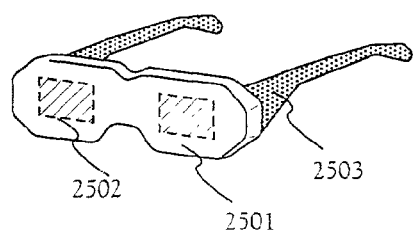

FIG. 8F shows a goggle type display device (a head mounted display device), and contains a main body 2501, a display portion 2502, and an arm portion 2503. The light-emitting device of the present invention can be used as the display portion 2502.

Figure 8G:
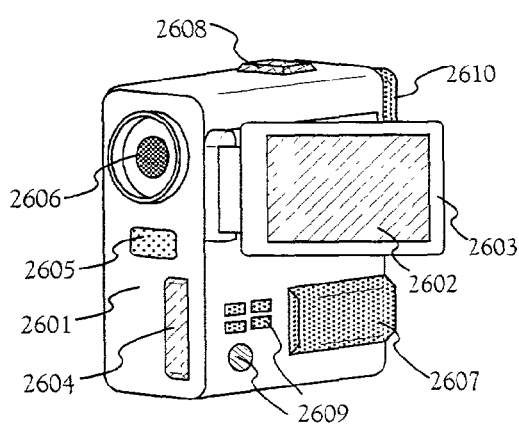

FIG. 8G is a video camera, and contains a main body 2601, a display portion 2602, a casing 2603, an external connection port 2604, a remote control receiving portion 2605, an image receiving portion 2606, a battery 2607, a sound input portion 2608, an operation key 2609 and an eyepiece portion 2610. The light-emitting device of the present invention can be used as the display portion 2602.

Figure 8H:
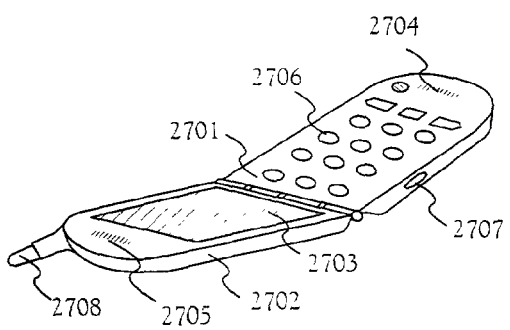

FIG. 8H shows a portable telephone, and contains a main body 2701, a casing 2702, a display portion 2703, a sound input portion 2704, a sound output portion 2705, operation keys 2706, an external connection port 2707 and an antenna 2708. The light emitting device of the present invention can be used as the display portion 2703. Note that by displaying white color characters in a black color background, the display portion 2703 can suppress the power consumption of the portable telephone.

Note that if the luminance of organic material increases in the future, then it will become possible to use the light emitting device of the present invention in a front type or a rear type projector by expanding and projecting light containing output image information with a lens or the like.

Further, the above electronic devices display often information transmitted through an electronic communication circuit such as the Internet and CATV (cable TV), and particularly situations of displaying moving images is increasing.

The response speed of organic materials is so high that the light-emitting device of the present invention are good for display of moving image.

In addition, since the light emitting device consumes power in the light emitting portion, it is therefore preferable to use the light emitting device for displaying information so as to make the light emitting portions as few as possible. Consequently, when using the light emitting device in a display portion mainly for character information, such as in a portable information terminal, in particular a cellular phone or a sound reproduction system, it is preferable to drive so as to form character information by the light emitting portions while non-light emitting portions are set as background.

As described above, the application range of this invention is extremely wide, and it may be used for electric devices in various fields. Further, the electronic device of this embodiment can be used the manufactured light-emitting device to the display portion by implementing the present invention.

In forming a pixel electrode of an EL element, a positioning function is given to a film forming chamber to make it possible to form a film of fine pattern by evaporation using a metal mask. A first passivation film having a high transmittance is formed after an EL layer is formed to prevent damage to the EL layer from sputtering that is employed to form an opposite electrode. The problems accompanying manufacture of a light emitting device having an upward emission type element thus can be solved. The processing is conducted by a multi-chamber type or in-line type integrated apparatus, whereby the EL element is formed of an EL material without being exposed to the air. Accordingly, a light emitting device using an EL material can be greatly improved in reliability.

What is claimed is:

1. A method of manufacturing a light emitting device, said method comprising the steps of:

forming a thin film transistor over a substrate;

forming a first conductive film over the thin film transistor by vacuum evaporation in a chamber selected from a first set of chambers connected to a first transferring chamber;

forming a second conductive film over the first conductive film by vacuum evaporation in a chamber selected from the first set of chambers;

transferring the substrate after forming the second conductive film to a second transferring chamber connected to a second set of chambers while maintaining the vacuum state, forming an organic film over the second conductive film by vacuum evaporation in at least one of the chambers selected from the second set of chambers;

transferring the substrate after forming the organic film to the first transferring chamber while maintaining the vacuum state, forming a passivation film over the organic film by vacuum evaporation in a chamber selected from the first set of chambers;

forming a light transmissive conductive film over the passivation film by sputtering in a chamber selected from the first set of chambers; and forming a diamond-like carbon film on the light transmissive conductive film in a chamber selected from the first set of chambers, wherein each of the first conductive film, the second conductive film, and the organic film is formed into a pattern using a mask, wherein the light transmissive conductive film comprises indium oxide and zinc oxide, wherein the step of forming the first conductive film through the step of forming the diamond-like carbon film are conducted continuously without exposing the substrate to an outside air, and wherein the first transferring chamber and the second transferring chamber are connected.

2. A method according to claim 1, wherein the second conductive film comprises an element selected from Group 1 or 2 in the periodic table.

3. A method according to claim 1, wherein the passivation film comprises a metal element having a light transmittance of 70% or more and a work function of 4.5 to 5.5 eV.

4. A method according to claim 1, wherein the light transmissive conductive film comprises a metal material having a sheet resistance of 50 Ω/□ or less and a light transmittance of 70% or more.

5. A method according to claim 1, wherein the mask is a metal mask.

6. A method according to claim 1, wherein the mask is formed using a charge coupled device in a film forming chamber.

7. A method according to claim 1, wherein the organic film comprises a laminated structure including a hole transporting layer, a light emitting layer, and an electron transporting layer.

8. A method according to claim 1, wherein the first transferring chamber and the second transferring chamber are connected through a third transferring chamber.

9. A method of manufacturing a light emitting device, said method comprising the steps of:

forming a thin film transistor over a substrate;

forming a first conductive film over the thin film transistor by vacuum evaporation in a chamber selected from a first set of chambers connected to a first transferring chamber;

forming a second conductive film over the first conductive film by vacuum evaporation in a chamber selected from the first set of chambers;

transferring the substrate after forming the second conductive film to a second transferring chamber connected to a second set of chambers while maintaining the vacuum state, forming an organic film over the second conductive film by vacuum evaporation in at least one of the chambers selected from the second set of chambers;

transferring the substrate after forming the organic film to the first transferring chamber while maintaining the vacuum state, forming a passivation film over the organic film by vacuum evaporation in a chamber selected from the first set of chambers;

forming a light transmissive conductive film over the passivation film by sputtering in a chamber selected from the first set of chambers;

forming an insulating film containing silicon on the light transmissive conductive film in a chamber selected from the first set of chambers;

forming a diamond-like carbon film on the insulating film in a chamber selected from the first set of chambers, and wherein each of the first conductive film, the second conductive film, and the organic film is formed into a pattern using a mask, wherein the light transmissive conductive film comprises indium oxide and zinc oxide, wherein the step of forming the first conductive film through the step of forming the diamond-like carbon film are conducted continuously without exposing the substrate to an outside air, and wherein the first transferring chamber and the second transferring chamber are connected.

10. A method according to claim 9, wherein the second conductive film comprises an element selected from Group 1 or 2 in the periodic table.

11. A method according to claim 9, wherein the passivation film comprises a metal element having a light transmittance of 70% or more and a work function of 4.5 to 5.5 eV.

12. A method according to claim 9, wherein the light transmissive conductive film comprises a metal material having a sheet resistance of 50 Ω/□ or less and a light transmittance of 70% or more.

13. A method according to claim 9, wherein the mask is formed using a charge coupled device in a film forming chamber.

14. A method according to claim 9, wherein the organic film comprises a laminated structure including a hole transporting layer, a light emitting layer, and an electron transporting layer.

15. A method according to claim 9 wherein the mask is a metal mask.

16. A method according to claim 9, wherein the first transferring chamber and the second transferring chamber are connected through a third transferring chamber.

17. A method according to claim 9, wherein the insulating film contains a silicon oxide or a silicon nitride.

18. A method of manufacturing a light emitting device, said method comprising the steps of:

forming a thin film transistor over a substrate;

forming a first conductive film over the thin film transistor by vacuum evaporation in a chamber selected from a first set of chambers connected to a first transferring chamber;

forming a second conductive film over the first conductive film by vacuum evaporation in a chamber selected from the first set of chambers;

transferring the substrate after forming the second conductive film to a second transferring chamber connected to a second set of chambers while maintaining the vacuum state, forming an organic film over the second conductive film by vacuum evaporation in at least one of the chambers selected from the second set of chambers;

transferring the substrate after forming the organic film to the first transferring chamber while maintaining the vacuum state, forming a passivation film over the organic film by vacuum evaporation in a chamber selected from the first set of chambers;

forming a light transmissive conductive film over the passivation film by sputtering in a chamber selected from the first set of chambers; and forming a diamond-like carbon film on the light transmissive conductive film in a chamber selected from the first set of chambers; and sealing the substrate with a thermally curable resin or a photosensitive resin in the first set of chambers, wherein each of the first conductive film, the second conductive film, and the organic film is formed into a pattern using a mask, wherein the light transmissive conductive film comprises indium oxide and zinc oxide, wherein the step of forming the first conductive film through the step of sealing the substrate are conducted continuously without exposing the substrate to an outside air, and wherein the first transferring chamber and the second transferring chamber are connected.

19. A method according to claim 18 wherein the second conductive film comprises an element selected from Group 1 or 2 in the periodic table.

20. A method according to claim 18 wherein the passivation film comprises a metal element having a light transmittance of 70% or more and a work function of 4.5 to 5.5 eV.

21. A method according to claim 18 wherein the light transmissive conductive film comprises a metal material having a sheet resistance of 50 Ω/□ or less and a light transmittance of 70% or more.

22. A method according to claim 18 wherein the mask is a metal mask.

23. A method according to claim 18, wherein the mask is formed using a charge coupled device in a film forming chamber.

24. A method according to claim 18, wherein the organic film comprises a laminated structure including a hole transporting layer, a light emitting layer, and an electron transporting layer.

25. A method according to claim 18, wherein the first transferring chamber and the second transferring chamber are connected through a third transferring chamber.

26. A method of manufacturing a light emitting device, said method comprising the steps of:

forming a thin film transistor over a substrate;

forming a first conductive film over the thin film transistor by vacuum evaporation in a chamber selected from a first set of chambers connected to a first transferring chamber;

forming a second conductive film over the first conductive film by vacuum evaporation in a chamber selected from the first set of chambers;

transferring the substrate after forming the second conductive film to a second transferring chamber connected to a second set of chambers while maintaining the vacuum state, forming an organic film over the second conductive film by vacuum evaporation in at least one of the chambers selected from the second set of chambers;

transferring the substrate after forming the organic film to the first transferring chamber while maintaining the vacuum state;

forming a passivation film over the organic film by vacuum evaporation in a chamber selected from the first set of chambers;

forming a light transmissive conductive film over the passivation film by sputtering in a chamber selected from the first set of chambers;

forming an insulating film containing silicon on the light transmissive conductive film in a chamber selected from the first set of chambers;

forming a diamond-like carbon film on the insulating film in a chamber selected from the first set of chambers; and sealing the substrate with a thermally curable resin or a photosensitive resin in the first set of chambers, wherein each of the first conductive film, the second conductive film, and the organic film is formed into a pattern using a mask, wherein the light transmissive conductive film comprises indium oxide and zinc oxide, wherein the step of forming the first conductive film through the step of sealing the substrate are conducted continuously without exposing the substrate to an outside air, and wherein the first transferring chamber and the second transferring chamber are connected.

27. A method according to claim 26 wherein the second conductive film comprises an element selected from Group 1 or 2 in the periodic table.

28. A method according to claim 26 wherein the passivation film comprises a metal element having a light transmittance of 70% or more and a work function of 4.5 to 5.5 eV.

29. A method according to claim 26 wherein the light transmissive conductive film comprises a metal material having a sheet resistance of 50 Ω/□ or less and a light transmittance of 70% or more.

30. A method according to claim 26 wherein the mask is a metal mask.

31. A method according to claim 26 wherein the insulating film contains a silicon oxide or a silicon nitride.

32. A method according to claim 26, wherein the mask is formed using a charge coupled device in a film forming chamber.

33. A method according to claim 26, wherein the organic film comprises a laminated structure including a hole transporting layer, a light emitting layer, and an electron transporting layer.

34. A method according to claim 26, wherein the first transferring chamber and the second transferring chamber are connected through a third transferring chamber.

* * * * *